US006251235B1

United States Patent
Talieh et al.

(10) Patent No.: US 6,251,235 B1
(45) Date of Patent: Jun. 26, 2001

(54) APPARATUS FOR FORMING AN ELECTRICAL CONTACT WITH A SEMICONDUCTOR SUBSTRATE

(75) Inventors: Homayoun Talieh, San Jose; Bulent Basol, Manhattan Beach, both of CA (US)

(73) Assignee: Nutool, Inc.

( * ) Notice: Subject to any disclaimer, the term of this patent is extended or adjusted under 35 U.S.C. 154(b) by 0 days.

(21) Appl. No.: 09/283,024

(22) Filed: Mar. 30, 1999

(51) Int. Cl.[7] .................................................. C25D 17/00
(52) U.S. Cl. ....................... 204/220; 204/221; 204/250; 204/224 R; 204/297.05
(58) Field of Search ................................... 204/219, 220, 204/221, 250, 224 R, 224 M, 297.05, 297.1; 439/179

(56) References Cited

U.S. PATENT DOCUMENTS

| | | | |
|---|---|---|---|
| 4,269,686 | * 5/1981 | Newman et al. | 204/212 |
| 5,429,733 | 7/1995 | Ishida. | |
| 5,447,615 | * 9/1995 | Ishida | 204/224 R |
| 5,779,492 | 7/1998 | Okuyama et al. | 439/179 |
| 5,833,820 | 11/1998 | Dubin et al. | 204/212 |
| 5,871,626 | * 2/1999 | Crafts et al. | 204/297.05 |
| 6,056,869 | * 5/2000 | Uzoh | 205/771 |

FOREIGN PATENT DOCUMENTS

| | | |
|---|---|---|
| 2763343 | 11/1998 | (FR). |
| 1350070 | 4/1974 | (GB). |
| 6-108285 | 4/1994 | (JP). |
| 11-054479 | 2/1999 | (JP). |
| WO 97/01657 | 1/1997 | (WO). |

* cited by examiner

Primary Examiner—Kathryn Gorgos
Assistant Examiner—Wesley A. Nicolas
(74) Attorney, Agent, or Firm—Pillsbury Winthrop LLP

(57) ABSTRACT

The present invention is directed to an apparatus for plating a surface of a semiconductor workpiece (wafer, flat panel, magnetic films, etc.) using a liquid conductor that makes contact with the outer surface of the workpiece. The liquid conductor is stored in a reservoir and pump through an inlet channel to the liquid chamber. The liquid conductor is injected into a liquid chamber such that the liquid conductor makes contact with the outer surface of the workpiece. An inflatable tube is also provided to prevent the liquid conductor from reaching the back face of the workpiece. A plating solution can be applied to the front face of the workpiece where a retaining ring/seal further prevents the plating solution and the liquid conductor from making contact with each other. Further, the present invention can be used to dissolve/etch a metal layer from the periphery of the workpiece.

21 Claims, 7 Drawing Sheets

APPARATUS FOR FORMING AN ELECTRICAL CONTACT WITH A SEMICONDUCTOR SUBSTRATE

FIELD OF THE INVENTION

The present invention relates generally to a method and apparatus for electroplating a metal on a semiconductor substrate. More particularly, the present invention is directed to a method and apparatus for forming electrical contacts on the semiconductor substrate using a liquid conductor during the plating process. Alternatively, electrical contacts may be formed using an inflatable tube that has either been coated with a conductive material or contains a conductive object. Furthermore, the present invention provides a method and apparatus for dissolving/etching a metal layer from the substrate edge.

BACKGROUND OF THE INVENTION

Plating is an important and necessary step in the high performance chip fabrication process. When plating, it is necessary to form a good ohmic contact with a seed layer on/or near a circumferential edge of a substrate. Different conventional techniques exist to accomplish this task. According to one technique, for example, a great number of contact fingers, upwards of 130, are used to form contacts with the seed layer on the circumferential edge of a wafer. The contact fingers, which are typically metallic, are coupled to the circumferential edge of the wafer in accordance with any known method.

FIG. 1A illustrates a top view of a conventional configuration showing contact fingers 12 coupled to the wafer 2 during the plating process. As illustrated, a large number of contact fingers 12 extending from a housing 11 are evenly distributed around the circumferential edge 7 of the wafer 2. The housing 11 has a ring shape corresponding to the shape of the circumferential edge 7 of the wafer 2. An electric potential (cathode) is then applied to the wires 13 or housing 11 that are further coupled to the contact fingers 12 within the housing 11. This, in turn, provides the electric potential to the circumferential edge 7 of the wafer 2, thereby allowing the wafer surface to be plated. Instead of using the contact fingers 12 as described above, the electric potential can be applied to the wafer using a ring conductor.

FIG. 1B illustrates a cross sectional view of a conventional plating apparatus as described with reference to FIG. 1A. An entire back face 6 of the wafer 2 rests against a conventional chuck 8, and a vacuum 10 is used to ensure that the wafer 2 is stationary with respect to the chuck 8 while loading and/or plating the wafer 2. Regions adjacent to the circumferential edge 7 of the front face 4 of the wafer 2 are coupled to the contact fingers 12 as described above. A plating solution, typically a metal solution, is flowed in the direction of arrow 18 to the front face 4 of the wafer 2. When an electric potential is applied between an anode electrode 19, and the circumferential edge 7 of the wafer 2, the front face 4 of the wafer can be plated with the metal species contained in the plating solution.

Contact fingers are critical components of the wafer plating process as they provide the necessary electrical potential to the wafer. However, conventional plating systems such as described above have many drawbacks and disadvantages. For example, during the plating process, metal from the plating solution may be electroplated on the contact fingers, thereby generating contaminating particles. In addition, the electroplated metal on the contact fingers increases contact resistance resulting in a high voltage drop and failure. Moreover, over time, the contact fingers are susceptible to corrosion and/or fatigue. Failure of such contact fingers then leads to non-uniform wafer plating, which may cause irreparable damage to the semiconductor wafer, thereby resulting in lost products and revenues for the manufacturer.

Thus, there remains a need for a semiconductor substrate plating method and apparatus that provides plating in a dependable and reliable manner. Accordingly, a more consistent method and apparatus for providing an electrical contact to a semiconductor substrate during plating is needed.

SUMMARY OF THE INVENTION

It is an object of the present invention to provide a method and apparatus that provides electric potential to the wafer using a liquid conductor.

It is another object of the present invention to provide a method and apparatus that plates the front face of the wafer while preventing the plating solution from reaching the back face and edge of the wafer.

It is a further object of the present invention to provide a method and apparatus that plates the front face of the wafer while preventing the liquid conductor from reaching the back face of the wafer.

It is yet another object of the present invention to provide a method and apparatus that recycles the liquid conductor.

It is a further object of the present invention to provide a method and apparatus that dissolves/etches a metal layer from the periphery of the wafer.

It is another object of the present invention to provide a method and apparatus that provides electric contacts to the wafer using an inflatable tube that has been coated with a conductive material.

It is a further object of the present invention to provide a method and apparatus that plates a semiconductor workpiece such as wafers, flat panels, and magnetic films in a reliable and dependable manner.

It is yet another object of the present invention to provide a more efficient method for establishing electrical contacts with the wafer.

These and other objects of the present invention are obtained by providing a method and apparatus that plates a semiconductor wafer using a liquid conductor as the electrical contacts. The present invention includes a liquid chamber for holding the liquid conductor during the plating process. The liquid conductor is stored in a reservoir and pump through an inlet channel to the liquid chamber. A tube is inflated to seal the back face of the wafer, and the liquid conductor is injected into the liquid chamber such that the liquid conductor makes contact with the circumferential edge of the wafer. An electric potential is applied to the liquid conductor. Then, a plating solution is applied to the front face of the wafer. After plating the wafer, the used liquid conductor is removed from the liquid chamber through an outlet channel. Subsequent wafers are processed, each time using a fresh liquid conductor.

Alternatively, the inflatable tube may be coated with a conductive material to form electric contacts with the circumferential edge of the wafer. In this embodiment, the liquid conductor is not needed.

A further implementation of the method and apparatus of the present invention is to provide an acid or etching solution to the chamber such that the metal layer on the periphery of the wafer can be dissolved/etched.

BRIEF DESCRIPTION OF THE DRAWINGS

These and other objects and advantages of the present invention will become apparent and more readily appreciated from the following detailed description of the presently preferred exemplary embodiment of the invention taken in conjunction with the accompanying drawings, of which.

DETAILED DESCRIPTION OF THE PREFERRED EMBODIMENTS

Figure 1A:
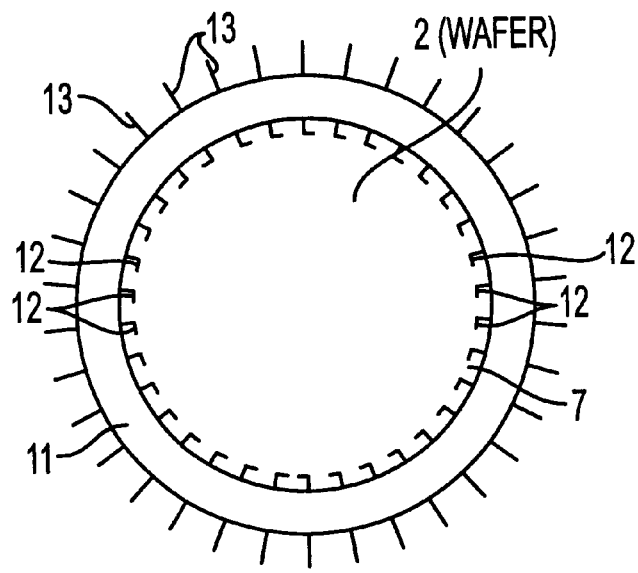
FIG. 1A illustrates a top view of a conventional configuration of the contact fingers coupled to a wafer during the wafer plating process.

The preferred embodiments of the present invention will now be described with reference to FIGS. 2–7, wherein like components are designated by like reference numerals throughout the various figures. In the first embodiment, the present invention is directed to a method and apparatus that uses a liquid conductor as electrical contacts on the wafer during the wafer plating process. The liquid conductor is preferably a solution containing indium, tin, gallium, mercury, acid, salt solution, or the like. Other alloys containing indium, tin, gallium, mercury, acid, salt solution, or the like may be used in accordance with the present invention. Since the liquid conductor should be in liquid phase at operating temperature and during the plating process, the melting point thereof will typically be in the range of 10° C. to 40° C.

In addition to the various types of solutions mentioned above, metal powders mixed with another solution may be used in accordance with the present invention as electric contacts on the wafer during the wafer plating process. For example, metal powders can be mixed with a carrier fluid, for example water, and delivered to the liquid chamber. Thus, what is important to note from this example is that metal powders mixed with a fluid and delivered to the liquid chamber may be used in lieu of the various types of solutions mentioned earlier.

Furthermore, although a semiconductor wafer will be used to describe the preferred embodiment of the present invention, other semiconductor workpiece such as a flat panel or magnetic film may be used in accordance with the present invention.

Figure 1B:
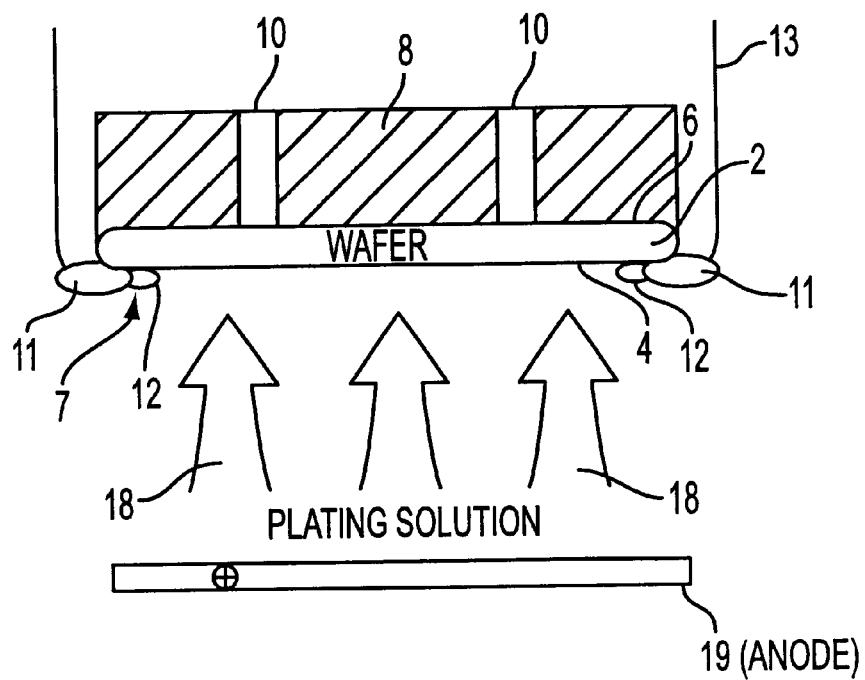
FIG. 1B illustrates a cross sectional view of a conventional plating apparatus.
Figure 2:
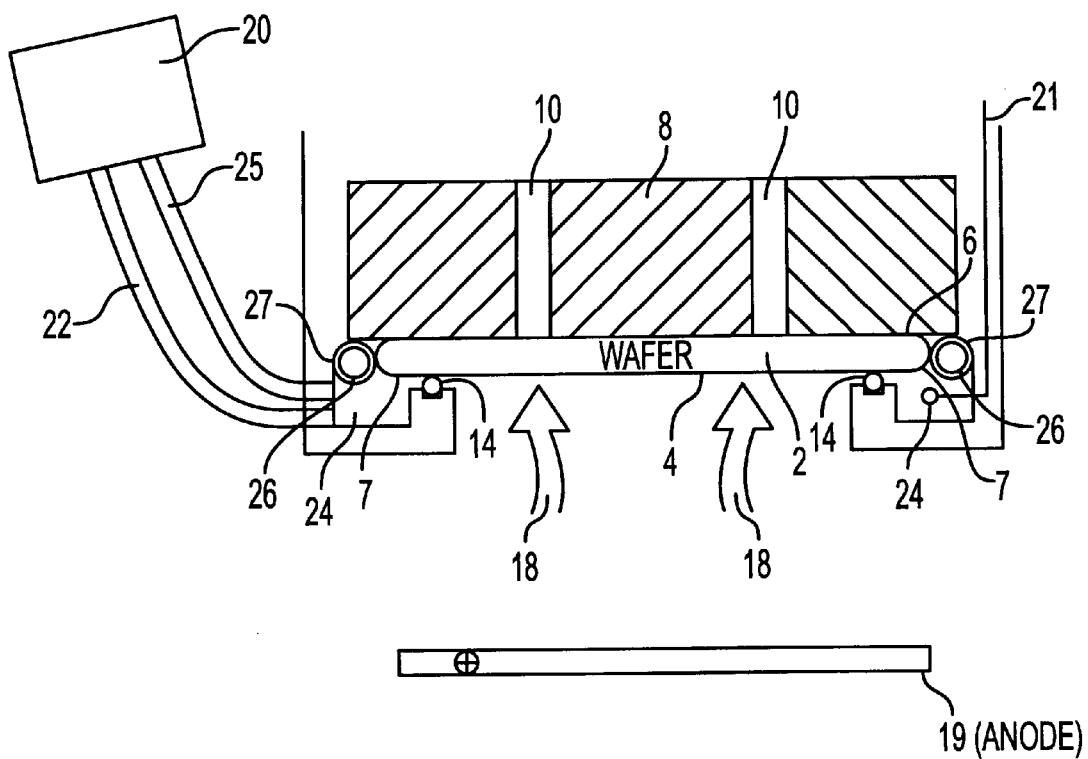
FIG. 2 illustrates a cross sectional view of a plating apparatus using a liquid conductor in accordance with the preferred embodiment of the present invention.

FIG. 2 illustrates a cross sectional view of a plating apparatus in accordance with the preferred embodiment of the present invention. Similar to FIG. 1, the wafer 2 has a front face 4 and a back face 6 resting against the chuck 8. A vacuum 10 is used to ensure that the wafer 2 is stationary with respect to the chuck 8 while the wafer 2 is being loaded and/or plated.

In the preferred embodiment of the present invention, a liquid conductor, rather than the contact fingers 12 as described with reference to FIG. 1, is used to form an ohmic contact with the circumferential edge 7 or regions adjacent to the front face 4 of the wafer 2. The liquid conductor is stored in a reservoir 20, which may be a single reservoir or multiple reservoirs. The liquid conductor is pumped from the reservoir 20 using a conventional pump (not shown) through an inlet channel 22 and injected into a liquid chamber 24. More than one pump may be used to pump the liquid conductor into the liquid chamber 24 when multiple reservoirs are used.

Figure 3:
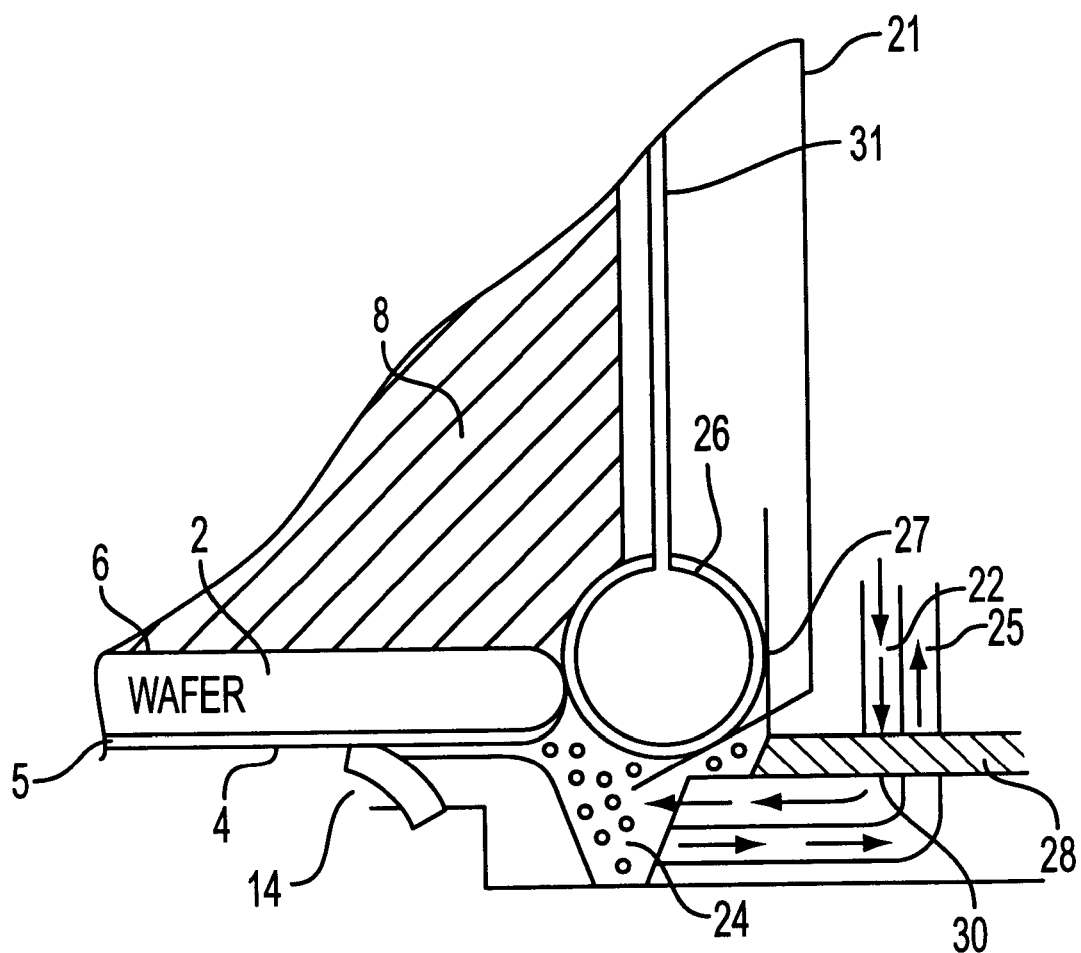
FIG. 3 illustrates an enlarged cross sectional view of a liquid chamber in accordance with the preferred embodiment of the present invention.

FIG. 3 illustrates an enlarged cross sectional view of the liquid chamber 24 in accordance with the preferred embodiment of the present invention. To form the liquid chamber 24 and prevent the liquid conductor from flowing to the back face 6 of the wafer, a tube 26 is inflated with gas before the liquid conductor is pumped/injected into the chamber 24. Thus, the inflated tube 26 seals the back face 6 of wafer 2 from the liquid conductor. The tube 26 is preferably made of an elastomer or reinforced elastomer material or other material that is flexible enough to form a liquid tight seal when inflated against the wafer 2 and the retaining wall 27 of the chamber 24. The tube 26 should also be strong enough to support the pressure of the injected gas.

In its deflated state, the tube 26 is attached to and rests in a groove along the retaining wall 27. When gas is injected from a gas source (not shown) through a gas line 31 that is connected to the inside of the tube 26, the tube 26 inflates until it makes a liquid tight seal against the edge of the wafer 2 and the retaining wall 27. At this stage, no additional gas is injected into the tube 26. The gas may be air, nitrogen, inert gas, or any other gas that is capable of inflating the tube 26. A valve can be provided to adjust the pressure and the gas flow rate depending on the size of the wafer and/or size of the chamber 24. Additionally, the gas line 31 can be used to remove the gas when deflating the tube 26. The tube 26 preferably has a bicycle inner-tube shape or bladder, corresponding to the shape of the circumferential edge 7 of the wafer 2.

Referring back to FIGS. 2 and 3, a nonconductive retainer ring/seal 14 is used to prevent the plating solution from reaching the back face 6 and the circumferential edge 7 of the wafer 2. The retaining ring/seal 14, shaped in the ring, is positioned on the wafer 2 between the liquid chamber 24 and the center of the wafer 2. The ring/seal 14 is preferably positioned less than 10 mm from the wafer edge. The retaining ring/seal 14 preferably pushes against a seed layer 5 on the front face 4 of the wafer 2 holding the wafer in proper position. A liquid tight sealed is obtained with the retainer ring/seal 14 so that the liquid conductor and the plating solution are kept isolated from each other. Thus, the entire back face 6 of the wafer 2 that rests against the chuck 8 and the front surface areas (typically the outer 1–10 mm surface) of the wafer 2, which are under the retaining ring/seal 14, are protected from the plating solution.

The liquid conductor is pumped and injected into the fluid chamber 24 via the inlet channel 22. A contact ring 28 may include a tunnel 30 such that the liquid conductor can be pumped/injected through the contact ring 28. When the liquid chamber 24 is filled, the liquid conductor 22 makes contact with the circumferential edge 7 of the wafer 2. When such contact is established, an electrical potential (cathode) can be applied to the liquid conductor 22 via wire/probe 21. Thus, the circumferential edge 7 of the wafer 2 also receives the same electric potential. A plating solution is then flowed in the direction of arrows 18 from an anode plate 19 to the front face 4 of the wafer 2. The liquid conductor 22 forms the ohmic contact with the wafer 2 such that plating is substantially uniform across the front face 4 of the wafer 2.

After plating the wafer 2, the liquid conductor in the liquid chamber 24 is removed via an outlet channel 25 to the reservoir 20 or a recycling reservoir (not shown). After removing the used liquid conductor, a fresh liquid conductor is pumped/injected into the chamber 24 for processing the next wafer. The present invention contemplates recycling the used liquid conductor via the recycling reservoir. Using the recycled liquid conductor reduces the costs associated with the current plating process, while providing a more efficient method of providing electric contacts.

Figure 4A:
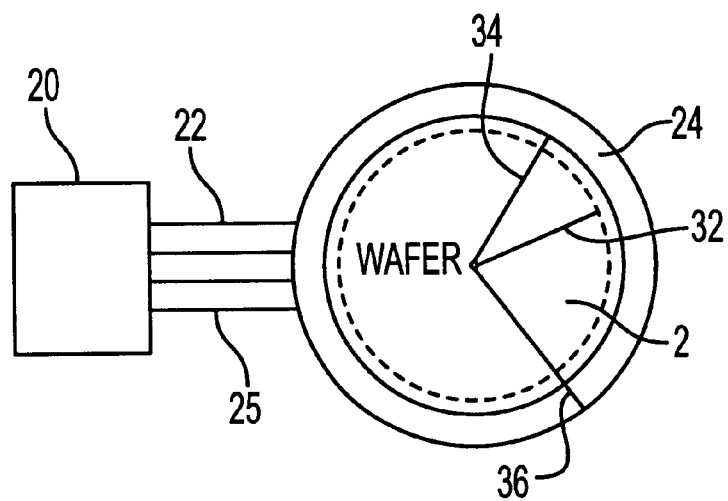
FIGS. 4A–4B illustrate top views of a plating apparatus using the liquid conductor in accordance with the preferred embodiment of the present invention.
Figure 4B:
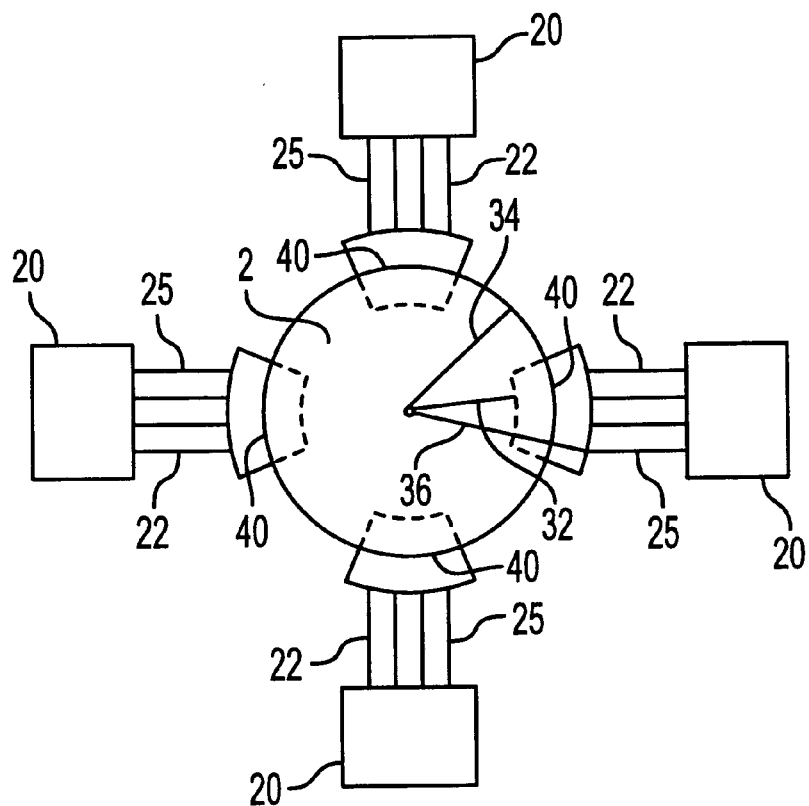

FIGS. 4A–4B illustrate top views of the plating apparatus of FIGS. 2–3 in accordance with the preferred embodiments of the present invention. First, from the top view, the liquid chamber 24 preferably has a ring shape with an inner radius 32 and an outer radius 36 from the center of the wafer 2. The wafer 2 has a radius 34 that is between the inner radius 32 and the outer radius 36 of the liquid chamber 24. The liquid conductor is pumped/injected into the liquid chamber 24 through an inlet channel 22 from the reservoir 20. Because of the ring shape, the liquid conductor in the liquid chamber 24 makes contact with the entire circumferential edge 7 of the wafer 2, which may include regions that are 1–10 mm from the wafer edge. FIG. 4A also illustrates an outlet channel 25 for removing the liquid conductor from the liquid chamber 24.

In another embodiment, multiple liquid chambers may be used in accordance with the present invention. FIG. 4B illustrates four compartmentalized liquid chambers 40. The compartmentalized liquid chambers 40 have the same inner radius 32 and the same outer radius 36 as in the liquid chamber 24 of FIG. 4A. The wafer radius 34 is also the same as that illustrated in FIG. 4A. In this configuration, four reservoirs 20 containing the liquid conductor may be used to provide the liquid conductor to each corresponding liquid chambers 40. The liquid conductor from each reservoir 20 is flowed through the corresponding inlet channels 22 into its respective liquid chambers 40. Because the liquid chambers 40 are compartmentalized, the liquid conductor contained therein makes contact with the circumferential edge 7 of the wafer only at those sections. The electric potential is applied to the liquid conductors in the four liquid chambers 40, thereby resulting in the electric potential being applied to the corresponding four sections of the wafer 2. Also, each liquid chamber 40 includes an outlet channel for removing the used liquid conductor.

Although four compartmentalized liquid chambers 40 are illustrated in FIG. 4B, more or less than four chambers may be used in accordance with the present invention.

Additionally, one skilled in the art will recognize that the present invention can be implemented using liquid chambers having various sizes and shapes than those described in FIG. 4A and 4B.

The present invention can further be used to dissolve/etch metal films from the edge and regions around the edge of a semiconductor substrate. It is very desirable to remove spurious metal or seed layer from the edge or backside of the wafer, since the metal films are not affected by chemical-mechanical process. The presence of these undesirable metal or poorly adhering film may lead to equipment contamination and cross-contamination when the flakes are sheered off the substrate. For example, the present invention may be used to dissolve a Cu seed layer or spurous Cu films at the wafer edge 7 or at any portion of the wafer that is enclosed by chamber 24, or any portion of the wafer between the seal 14 and another seal (not shown) on the wafer backside 6.

After performing the metal deposition process and removing the liquid conductor from the chamber 24, a copper etching solution, such as 5–20% nitric acid, or acidified 3–10% ammonium persulfate or a solution of 5–20% sulfuric and hydrogen peroxide may be injected into the chamber 24 to dissolve any undesired Cu films on the substrate. The time period for etching may range from 2–15 seconds, but preferably between 5–10 seconds. After the edge is cleaned, the metal etchant is removed and stored in a different reservoir (not shown) than reservoir 20. The metal etchant can be flowed through inlet channel 22 and outlet channel 25 to/from chamber 24. Such etching process can be performed using the chamber 24 without altering the configuration or chamber materials as described earlier herein. After such etching process, the chamber 24 and the circumferential edge 7 of the wafer 2 can be rinsed with a rinsing solution as known in the art.

Figure 5:
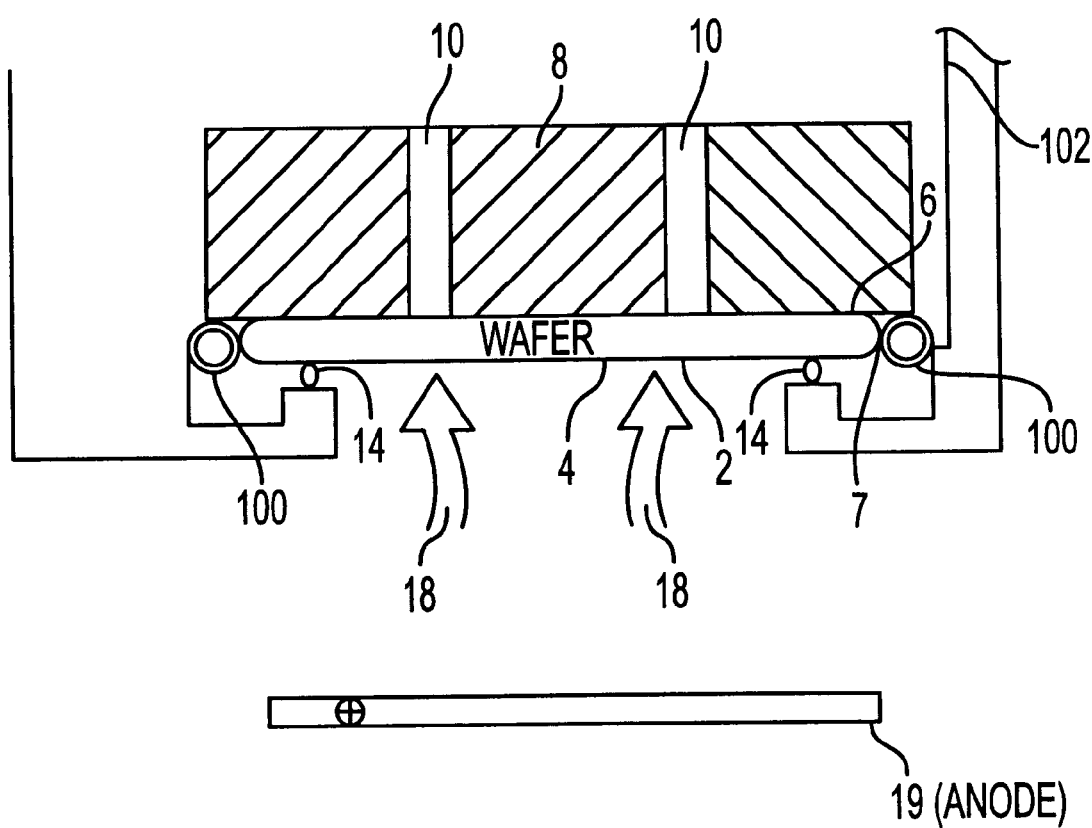
FIG. 5 illustrates a cross sectional view of a plating apparatus using a coated inflatable tube in accordance with another preferred embodiment of the present invention.

FIG. 5 illustrates a cross sectional view of a plating apparatus using a coated inflatable tube in accordance with another preferred embodiment of the present invention. FIG. 5 illustrates the wafer 2 having the front face 2, the back face 6 resting against the chuck 8, and the retaining ring/seal 14 similar to those described above and illustrated in FIG. 2.

In the embodiment of FIG. 5, a tube 100 is coated with a conductive material such that when the tube 100 is inflated, the tube 100 is capable of making an electric contact with the circumferential edge 7 of the wafer 2. The tube 100 is preferably coupled to an electric contact 102 (wire) for applying an electric potential (cathode) to the tube 100. The outer tube surface is preferably coated with a conductive material such as metal or polymer. The tube 100 further provides uniform contact and pressure along the periphery of the wafer, which may not necessarily be perfectly flat, because the tube 100 can conform according to the shape of the circumferential edge 7 of the wafer 2. Thus, in this embodiment, a liquid conductor is no longer needed because the tube 100 can be used as the cathode contact with the wafer 2.

Figure 6A:
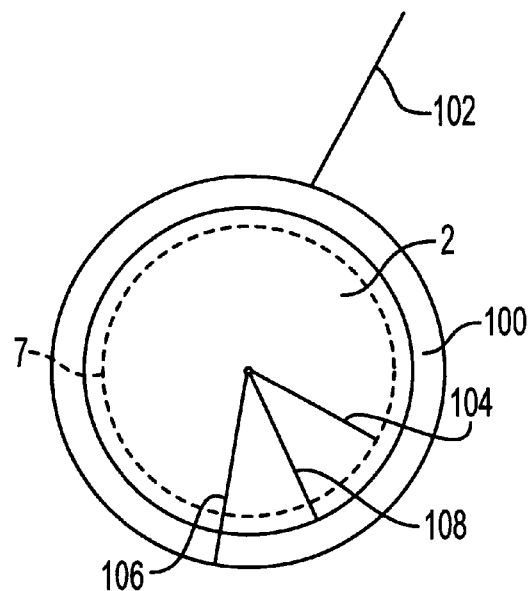
FIGS. 6A–6B illustrate top views of a plating apparatus using the coated inflatable tube in accordance with the preferred embodiments of the present invention.
Figure 6B:
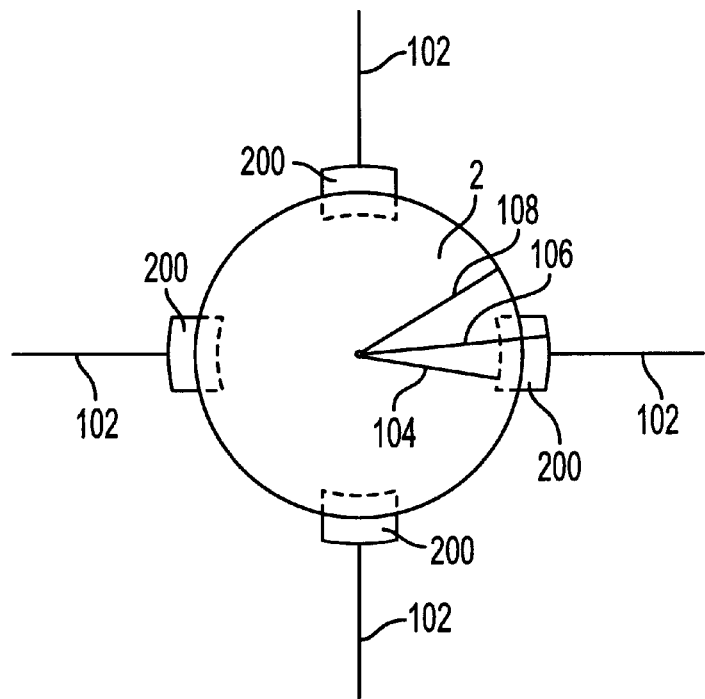

FIGS. 6A–6B illustrate top views of a plating apparatus using the coated inflatable tube or tubular ring in accordance with the preferred embodiments of the present invention. First, as illustrated in FIG. 6A, the tube 100 has an inner radius 104 and an outer radius 106 from the center of the wafer 2. The wafer 2 has a radius 108 that is between the inner radius 104 and the outer radius 106 of the tube 100. Because the tube 100 has the bicycle inner-tube shape (inflatable ring), the surface corresponding to the inner radius 104 of the tube 100 makes contact with the entire circumferential edge 7 of the wafer 2. The wire 102 coupled to the tube 100 provides the necessary electric potential to the entire circumferential edge 7 of the wafer 2 during the plating process.

In another embodiment, multiple tubes 200 may be used in accordance with the present invention. In FIG. 6B, four tubes 200 are used, and each tube 200 has the same inner radius 104 and the same outer radius 106 as described above. The wafer radius 108 again is between the inner radius 104 and the outer radius 106. Each wire 102 is coupled to an outer surface of the corresponding tube 200. Because the tubes 200 are spaced apart from each other, they form electric contacts with the circumferential edge 7 of the wafer 2 only at four sections. An electric potential can be applied to the four tubes 200, thereby providing the same electric potential to the wafer 2. Additionally, more or less than four tubes and four wires may be used in accordance with the present invention.

Figure 7A:
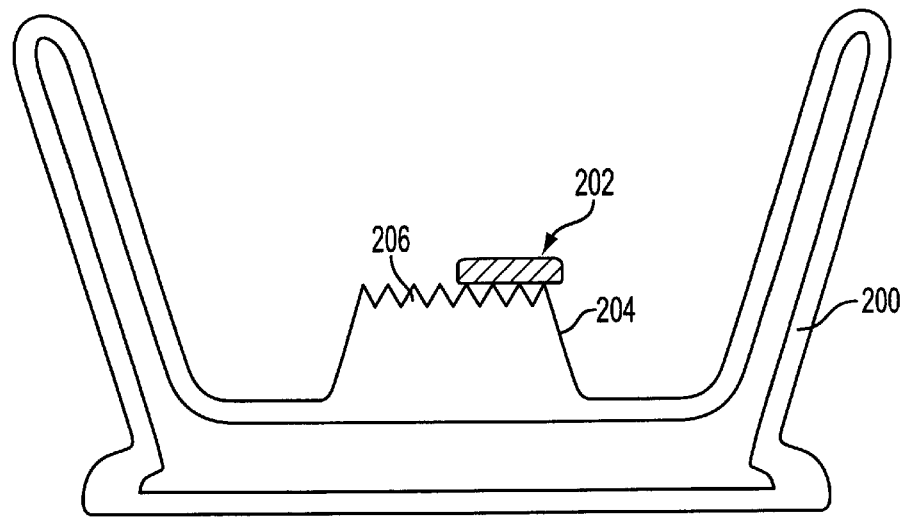
FIGS. 7A–7B illustrate cross sectional views of an inflatable tube having a conductive object in accordance with the preferred embodiment of the present invention.
Figure 7B:
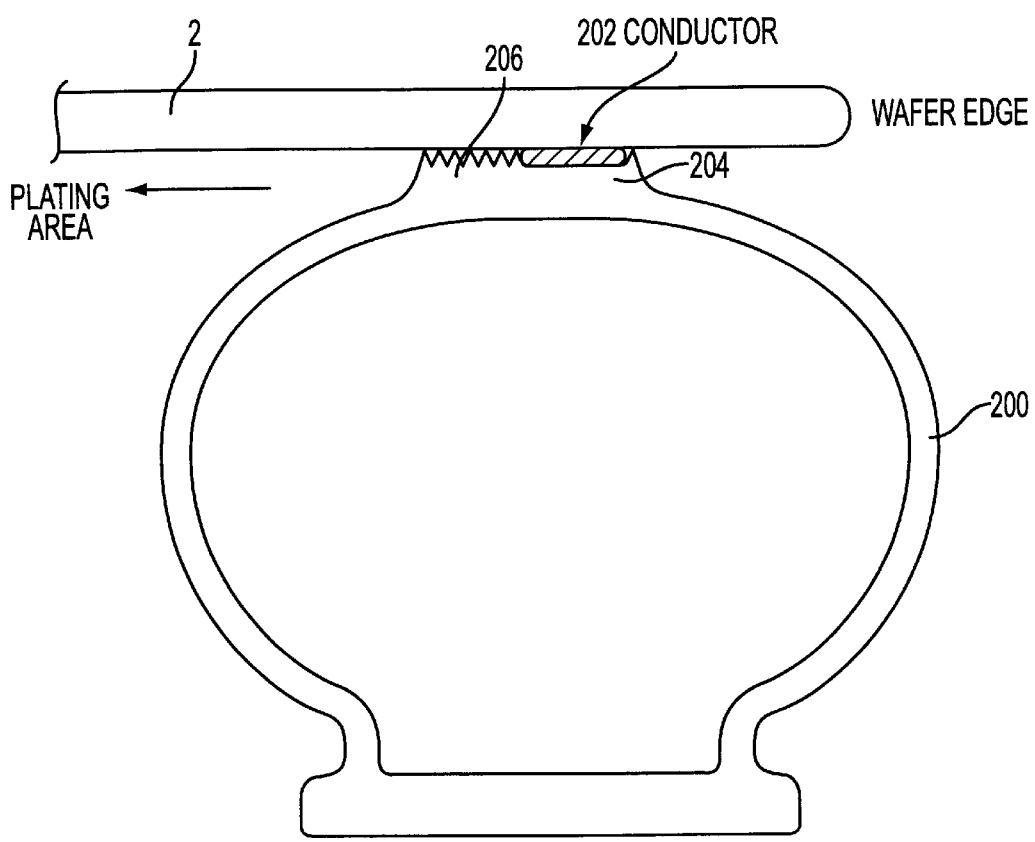

In an alternative embodiment, instead of coating the inflatable tube with the conductive material as described above, a conductive object such as a plate, wire, ribbon, or the like, may be attached to the inflatable tube. FIGS. 7A–7B illustrate enlarged cross sectional views of the inflatable tube 200 with the attached conductive object 202. FIGS. 7A–7B illustrate the tube 200 in its deflated and inflated states. The conductive object 202 is attached to the tube 200 on a portion 204 such that when the tube is inflated, the conductive object 202 will form a contact with the wafer 2. When the contact is made between the conductive object 202 and the wafer 2, a section 206 of the inflatable tube that is adjacent to the conductive object 202 forms a liquid tight seal against the wafer 2. This prevents the plating solution from making contact with the conductive object 202. The conductive material 202 can be attached to the inflatable tube 200 using any conventional method such as an adhesive, or the like. Furthermore, a conductive wire or other conventional methods of applying an electric potential to the conductive object 202 may be used in accordance with the present invention.

The present invention enjoys general applicability in plating any of the various metals on any type of substrate, including Cu, Cu-alloys, Au, Ni, Pt, precious metal, lead-tin solder, lead-free solder, magnetic films such as permalloy and their respective alloys, during the manufacturing of semiconductor devices on a semiconductor substrate. Also, the embodiments of the present invention can be practiced in conventional apparatus that are adapted to employ an inflatable tube and a liquid chamber having a liquid conductor.

In the previous descriptions, numerous specific details are set forth, such as specific materials, structures, chemicals, processes, etc., to provide a thorough understanding of the present invention. However, as one having ordinary skill in the art would recognize, the present invention can be practiced without resorting to the details specifically set forth.

Although various preferred embodiments of the present invention have been disclosed for illustrative purposes, those skilled in the art will appreciate that various modifications, additions and/or substitutions are possible without departing from the scope and spirit of the present invention as disclosed in the claims.

We claim:

1. A semiconductor workpiece plating apparatus for plating a front surface portion of a semiconductor workpiece, comprising:
    a workpiece support adapted to support the semiconductor workpiece such that the front surface portion is disposed to allow plating of a conductor within an electrolyte thereon;
    an anode; and
    a liquid conductor cathode adapted to make an ohmic contact with a cathode surface portion of the semiconductor workpiece that is different than the front surface portion of the semiconductor workpiece so that substantially uniform plating of the conductor on the front surface portion can occur upon application of power.

2. An apparatus according to claim 1, wherein the liquid conductor cathode comprises one of indium, tin, gallium, mercury, acidic solution, and a salt solution.

3. An apparatus according to claim 1, wherein the liquid conductor cathode comprises an alloy or a mixture from a group consisting of indium, tin, gallium, mercury, acidic solution, and a salt solution.

4. An apparatus according to claim 1 further comprising a wire coupled to the liquid conductor cathode.

5. An apparatus according to claim 1, wherein the liquid conductor cathode is adapted to provide the ohmic contact to the cathode surface portion at only an entire circumferential edge of the semiconductor workpiece.

6. An apparatus according to claim 1, wherein the liquid conductor cathode is adapted to provide the ohmic contact to the cathode surface portion at only predetermined areas of a circumferential edge of the semiconductor workpiece.

7. An apparatus according to claim 1 further comprising a chamber adapted to hold the liquid conductor cathode, the chamber including:
    a tube adapted to prevent the liquid conductor cathode from reaching a back surface of the semiconductor workpiece; and
    a seal adapted to prevent the liquid conductor cathode from reaching the front surface of the semiconductor workpiece.

8. An apparatus according to claim 7, wherein the tube is inflated with a gas.

9. An apparatus according to claim 7 further comprising:
    one or more reservoirs adapted to store the liquid conductor;
    one or more inlet channels, wherein the one or more inlet channels are used to flow the liquid conductor from the one or more reservoirs to the chamber; and
    one or more outlet channels, wherein the one or more outlet channels are used to remove the liquid conductor from the chamber.

10. An apparatus according to claim 1, wherein the liquid conductor cathode includes a metallic powder.

11. An apparatus according to claim 1, wherein the semiconductor workpiece comprises one of a wafer, flat panel, and a magnetic film.

12. An apparatus according to claim 1 further including a chamber adapted to hold the liquid conductor when the liquid conductor makes the ohmic contact with the semiconductor workpiece.

13. An apparatus according to claim 1 wherein the cathode surface portion of the workpiece is a circumferential edge of the workpiece.

14. An apparatus for removing a metal layer from a circumferential edge of a semiconductor workpiece using an etching solution, comprising:
    a workpiece support adapted to support the semiconductor workpiece such that the circumferential edge of the semiconductor workpiece can be etched; and
    an etching chamber adapted to hold the etching solution while the etching solution removes a portion of the metal layer from the circumferential edge of the semiconductor workpiece, the etching chamber including;
    a tube adapted to prevent the etching solution from reaching a back surface portion of the semiconductor workpiece; and
    a seal adapted to prevent the etching solution from reaching a front surface portion of the semiconductor workpiece.

15. An apparatus according to claim 14, wherein the etching solution is adapted to remove the portion of the metal layer from the entire circumferential edge of the semiconductor workpiece.

16. An apparatus according to claim 14, wherein the etching solution is adapted to remove the portion of the metal layer from predetermined areas of the circumferential edge of the semiconductor workpiece.

17. An apparatus according to claim 14, wherein the semiconductor workpiece comprises one of a wafer, flat panel, and a magnetic film.

18. A semiconductor workpiece plating apparatus for plating a front surface portion of a semiconductor workpiece, comprising:

workpiece support means for supporting the semiconductor workpiece such that the front surface portion is disposed to allow plating of a conductor within an electrolyte thereon;

an anode;

a liquid conductor cathode adapted to make an ohmic contact with a cathode surface portion of the semiconductor workpiece that is different than the front surface portion of the semiconductor workpiece so that substantially uniform plating of the conductor on the front surface portion can occur upon application of power; and chamber means for holding the liquid conductor within a circumferential area of the semiconductor workpiece when the liquid conductor makes the ohmic contact with the semiconductor workpiece.

19. An apparatus according to claim 18, wherein the liquid conductor cathode is adapted to provide the ohmic contact to the cathode surface portion at an entire circumferential edge of the semiconductor workpiece.

20. An apparatus according to claim 18, wherein the liquid conductor cathode is adapted to provide the ohmic contact to the cathode surface portion at only predetermined areas of the circumferential edge of the semiconductor workpiece.

21. An apparatus according to claim 18 wherein the chamber means includes:

a tube adapted to prevent the liquid conductor cathode from reaching a back surface of the semiconductor workpiece; and a seal adapted to prevent the liquid conductor cathode from reaching the front surface of the semiconductor workpiece.

* * * * *